(12) United States Patent
Bartling et al.

(10) Patent No.: US 12,052,335 B2
(45) Date of Patent: Jul. 30, 2024

(54) SERIAL RECEIVER CIRCUIT WITH FOLLOWER SKEW ADAPTATION

(71) Applicant: Apple Inc., Cupertino, CA (US)

(72) Inventors: Ryan D. Bartling, Campbell, CA (US); Jafar Savoj, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/161,995

(22) Filed: Jan. 31, 2023

(65) Prior Publication Data

US 2024/0097875 A1 Mar. 21, 2024

Related U.S. Application Data

(60) Provisional application No. 63/376,205, filed on Sep. 19, 2022.

(51) Int. Cl.
*H04L 7/033* (2006.01)
*H04L 7/00* (2006.01)
*H04L 7/02* (2006.01)

(52) U.S. Cl.
CPC .......... *H04L 7/0058* (2013.01); *H04L 7/0062* (2013.01); *H04L 7/02* (2013.01); *H04L 7/0066* (2013.01)

(58) Field of Classification Search
CPC .................. H04L 7/033; H04L 7/0062; H04L 2025/0349; H04L 2027/004; H04L 2027/0067; H04L 2027/0069; H04L 25/062; H04L 7/0004; H04B 10/11; H04B 10/503; H04B 10/66; H04B 10/40; H04B 10/1121; H04B 1/123; H04B 10/1123; H04B 10/2507; H04B 10/69; H03L 7/0807; H03L 7/087; H03L 7/0814; H03L 7/07; H03L 7/081; H03L 7/0812; H03L 7/0995; H03L 7/089; H03L 7/0891
USPC ......................................................... 375/229
See application file for complete search history.

(56) References Cited

U.S. PATENT DOCUMENTS

| | | | |
|---|---|---|---|
| 8,181,058 B2 | 5/2012 | Su et al. | |
| 9,225,324 B2 | 12/2015 | Arcudia et al. | |
| 9,430,148 B2 | 8/2016 | Wilson et al. | |
| 2013/0243056 A1* | 9/2013 | Chmelar | H04L 7/033 375/295 |
| 2013/0243107 A1* | 9/2013 | Chmelar | H04L 7/033 375/259 |
| 2014/0132320 A1* | 5/2014 | Sindalovsky | H03L 7/0807 327/159 |

(Continued)

FOREIGN PATENT DOCUMENTS

KR  101470599 B1  12/2014

*Primary Examiner* — Eva Y Puente
(74) *Attorney, Agent, or Firm* — Kowert, Hood, Munyon, Rankin & Goetzel, P.C.; Dean M. Munyon

(57) ABSTRACT

A serial data receiver circuit included in a computer system may include both an analog and an ADC-based receiver circuit. A front-end circuit generates different equalized signals based on received signals that encode a serial data stream that includes multiple data symbols. During startup of a communication channel, phase information generated by the analog receiver circuit may be used to generate clock signals for the ADC-based receiver circuit. After a period of time, the ADC-based receiver circuit can generate its own phase information to be used in the generation of the clock signals.

20 Claims, 11 Drawing Sheets

(56) References Cited

U.S. PATENT DOCUMENTS

2023/0110475 A1* 4/2023 Valliappan ........ H04L 25/03114
 375/232
2023/0246800 A1* 8/2023 Song ....................... H04L 7/033
2024/0089004 A1* 3/2024 Mak ........................ H04J 14/02

* cited by examiner

SERIAL RECEIVER CIRCUIT WITH FOLLOWER SKEW ADAPTATION

PRIORITY INFORMATION

The present application claims priority to U.S. Provisional App. No. 63/376,205, entitled "Serial Receiver Circuit With Follower Skew Adaptation," filed Sep. 19, 2022, the disclosure of which is incorporated by reference herein in its entirety.

BACKGROUND

Technical Field

This disclosure relates to the field of high-speed communication interface design and, in particular, to phase recovery using an analog receiver in an analog-to-digital converter (ADC)-based receiver circuit.

Description of the Related Art

Computing systems typically include a number of interconnected integrated circuits. In some cases, the integrated circuits may communicate using communication channels or links to transmit and receive data bits. The communication channels may support parallel communication, in which multiple data bits are transmitted in parallel, or serial communication, in which data bits are transmitted one bit at a time in a serial fashion.

The data transmitted between integrated circuits may be encoded to aid in transmission. For example, in the case of serial communication, data may be encoded to provide sufficient transitions between logic states to allow for clock and data recovery circuits to operate. Alternatively, in the case of parallel communication, the data may be encoded to reduce switching noise or to improve signal integrity.

During transmission of the data, the physical characteristics of the communication channel may attenuate a transmitted signal associated with a particular data bit. For example, the impedance of wiring included in the communication channel or link may attenuate certain frequency ranges of the transmitted signal. Additionally, impedance mismatches between wiring included in the communication channel and devices coupled to the communication channel may induce reflections of the transmitted signal, which may degrade subsequently transmitted signals corresponding to other data bits.

Figure 1:
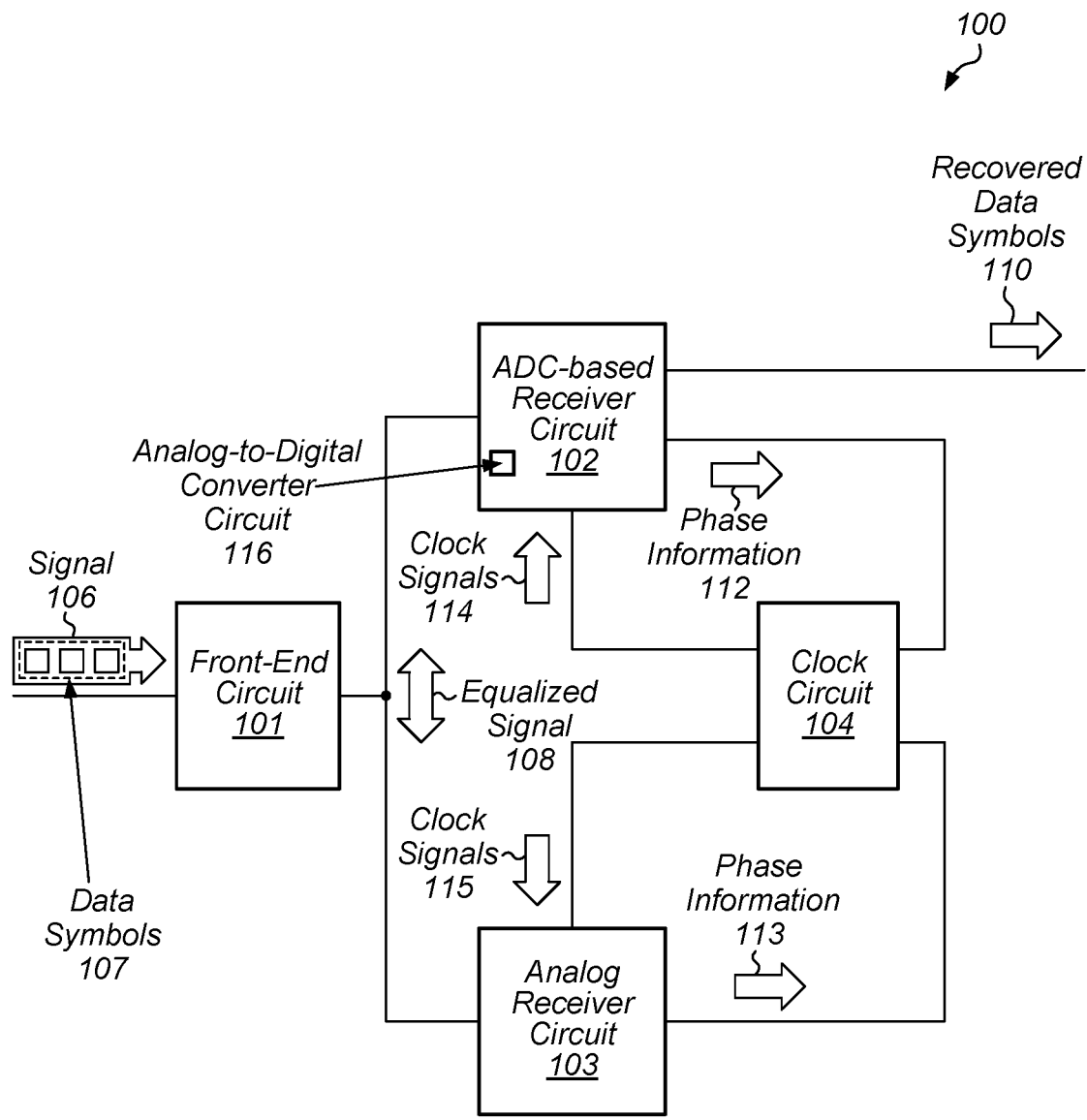
FIG. 1 is a block diagram of an embodiment of a serial data receiver circuit for a computer system.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed but, on the contrary, the intention is to cover all modifications, equivalents and alternatives falling within the spirit and scope of the appended claims.

DETAILED DESCRIPTION OF EMBODIMENTS

A computing system may include one or more integrated circuits, such as, e.g., a central processing unit (CPU) and memories. Each one of the integrated circuits of the computing system may communicate through either a serial or parallel interface. In a parallel interface, multiple data bits are communicated simultaneously, while in a serial interface, data is communicated as a series of sequential single data bits. When employing a serial interface to communicate data between two devices included in a computing system, the data may be transmitted according to different protocols. For example, the data may be transmitted using return to zero (RZ), non-return to zero (NRZ), pulse amplitude modulation (PAM), or any suitable combination thereof.

Serial data streams are often transmitted without an accompanying clock signal. In such cases, a clock signal is recovered from the serial data stream (in a process referred to as "clock recovery") and used for sampling the serial data stream to determine the values of the included data symbols (in a process referred to as "data recovery"). Various techniques can be employed to recover both the data and the clock signal. For example, a receiver circuit may generate a clock signal whose frequency is approximately the same as that of a clock signal used to create the data stream. A phase-locked loop circuit may then be used to phase align the clock signal with transitions in the serial data stream. Alternatively, the serial data stream may be oversampled, i.e., sampled at a higher frequency than that of the clock signal used to generate the serial data stream.

Receiver circuits for serial data streams may be analog based, or they may employ analog-to-digital converter (ADC) circuits. ADC-based receiver circuits convert an equalized version of input data signals into bits in the digital domain, allowing additional processing (e.g., feed-forward equalization) to be performed as digital signal processing operations.

In new interconnect standards, receiver circuits are required to support a wide range of baud rates. As used and defined herein, baud rate (or "symbol rate") is a rate at which information is transmitted via a communication channel. For example, in PCIE, the data rates can vary from 2.5 Gbaudps to 32 Gbaudps. At the lower end of such a range, an analog-based received circuit can provide a power-efficient solution to sample a signal transmitted along the communication channel. As the baud rate of the signal increases, however, the analog-based receiver circuit may not provide the performance needed to recover the data consistently, and ADC-based receiver circuits may be employed to provide the desired performance.

Unlike analog receiver circuits, ADC-based receiver circuits are typically limited to performing phase detection, i.e., detecting where the data symbols are in the received signal, using data samples. Often, Mueller-Muller phase detection circuits are employed to determine whether the average sampling position of the ADC circuit is early or late. Since the samples generated by the ADC circuit in an ADC-based receiver circuit are digitally processed, the proportional path loop latency for an ADC-based receiver circuit can be larger than that of an analog receiver circuit. In some cases, however, long proportional path loop latencies may result in it not being possible to achieve desired clock-data recovery bandwidth specifications.

When communication is first established on a communication channel, many of the settings needed for an ADC-based receiver circuit to perform digital signal processing on recovered symbols have not yet been established and adapted for the characteristics of the signal being transmitted on the communication channel. During the time in which the needed settings are established, the ADC-based receiver circuit is out of phase lock which can result in an increase in the bit error rate.

The embodiments illustrated in the drawings and described below may provide techniques for using a high-bandwidth phase recovery circuit in an analog receiver circuit to generate phase information during startup of a communication channel, or during post-startup for improved clock-data recovery bandwidth. Clock generator circuits for an ADC-based receiver circuit can use the generated phase information from the analog receiver circuit, while a low-bandwidth phase recovery circuit in the ADC-based receiver circuit locks to the phase of the data on the communication channel. The analog receiver circuit is used to track edge locations of data symbols in an input signal that is used by both the analog receiver circuit and the ADC-based receiver circuit. Sampling positions of the ADC-based receiver is adjusted, using a low-bandwidth control loop, to align to desired positions with the data symbols. By using the tracking the edge positions and aligning the sampling positions in such a fashion, the period of time needed to achieve phase lock can be decreased, reducing the bit error rate.

A block diagram depicting an embodiment of a hybrid receiver circuit is depicted in FIG. 1. As illustrated, hybrid receiver circuit 100 includes front-end circuit 101, ADC-based receiver circuit 102, analog receiver circuit 103, and clock circuit 104.

Front-end circuit 101 is configured to generate equalized signal 108 using signal 106. In various embodiments, signal 106 encodes a serial data stream that includes data symbols 107. Although front-end circuit 101 is depicted as generating a single equalized signal that is used by both ADC-based receiver circuit 102 and analog receiver circuit 103, in other embodiments, front-end circuit 101 may be configured to generate different equalized signals for each of ADC-based receiver circuit 102 and analog receiver circuit 103.

In some embodiments, signal 106 may encode data symbols 107 according to one of various symbol encodings. For example, signal 106 may be transmitted according to RZ, NRZ, PAM3, or any other suitable symbol encoding. It is noted that although a single signal is depicted as encoding data symbols 107, in other embodiments, multiple signals may be employed to encode data symbols 107. For example, in some cases, two signals may be employed to encode data symbols 107 when differential signaling standards are used.

ADC-based receiver circuit 102 includes analog-to-digital converter circuit 116, and is configured, based on the baud rate of the serial data stream that includes data symbols 107, to generate recovered data symbols 110 using clock signals 114 and equalized signal 108. As described below, ADC-based receiver circuit 102 may include multiple analog-to-digital converter circuits that sample equalized signal 108 with different resolutions. In various embodiments, different ones of the multiple analog-to-digital converter circuits may be employed based on the baud rate of the serial data stream that includes data symbols 107.

Analog receiver circuit 103 is configured, based on the baud rate of the serial data stream that includes data symbols 107, to generate phase information 113 using clock signals 115 and equalized signal 108. In various embodiments, phase information 113 may be based on a phase difference between clock signals 115 and data symbols 107. As described below, phase information 113 may be determined using information indicative of edges of different ones of data symbols 107.

In various embodiments, analog receiver circuit 103 may be implemented using primarily analog circuits that perform various functions (e.g., decision-feedback equalization) in the analog domain. Although only a single analog receiver circuit is depicted in the embodiment of FIG. 1, in other embodiments, additional analog receiver circuits may be employed, each configured to be activated under corresponding sets of conditions (e.g., input data stream baud rate, channel conditions, and the like).

Clock circuit 104 is configured to generate clock signals 115 using phase information 113. Additionally, clock circuit 104 can be configured to generate clock signals 114 using phase information 113. In various embodiments, clock circuit 104 may be configured to generate clock signals 114 using phase information 113. Clock circuit 104 may be further configured to generate clock signals 114 using phase information 112 after a given period of time has elapsed since a beginning of a transmission of signal 106. In some embodiments, clock circuit 104 may be configured to generate clock signals 114 using both phase information 112 and phase information 113.

In some embodiments, clock circuit 104 is configured, in response to an activation of a foreground calibration operation, to generate clock signals 114 using phase information 113, phase information 112, or any suitable combination thereof. It is noted that during the foreground calibration operation, data symbols 107 may include a test data pattern. Clock circuit 104 may, in other embodiments, be configured, in response to an activation of a background calibration operation, to adjust respective phases of clock signals 114 over a range of phase offsets. It is further noted that during the background calibration operation, a test data pattern may not be used.

Although clock signals 114 and clock signals 115 are depicted as being a single wire, in various embodiments, clock signals 114 and clock signals 115 may include multiple clock signals with respective phases.

In various embodiments, ADC-based receiver circuit 102 is configured to determine phase information 112 during the generation of recovered data symbols 110. Phase information 112 may include information indicative of phase error detected during the generation of recovered data symbols 110, and phase information 113 may include information indicative of phase error detected by analog receiver circuit 103 by sampling equalized signal 108.

Figure 2:
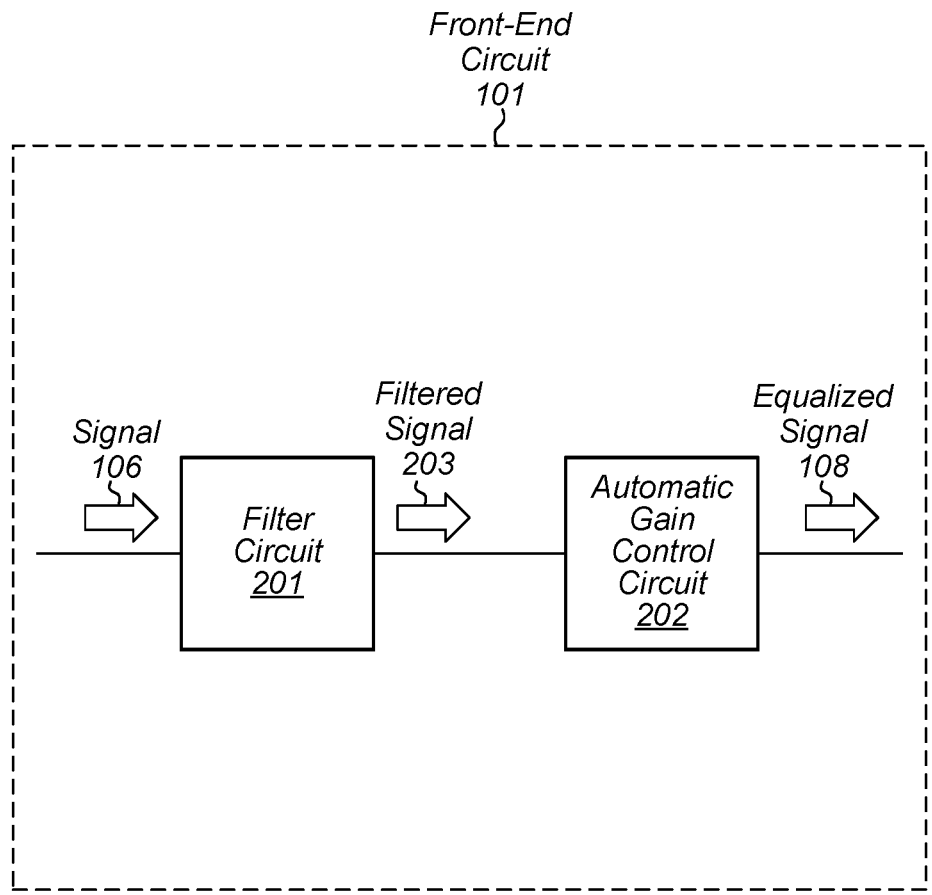
FIG. 2 is a block diagram of an embodiment of an analog front-end circuit for a serial data receiver circuit.

Turning to FIG. 2, a block diagram of an embodiment of front-end circuit 101 is depicted. As illustrated, front-end circuit 101 includes filter circuit 201, and automatic gain control circuit 202. Although front-end circuit 101 is depicted as generating a single equalized signal, in other embodiments, front-end circuit 101 may be configured to generate any suitable number of equalized signals using signal 106.

Filter circuit 201 is configured to generate filtered signal 203 using signal 106. In various embodiments, to generate filtered signal 203, filter circuit 201 may be further configured to attenuate high-frequency noise in signal 106. In some cases, filter circuit 201 may be further configured to attenuate low-frequency components at or near DC levels in signal 106.

Automatic gain control circuit 202 is configured to generate equalized signal 108 using filtered signal 203. In various embodiments, automatic gain control circuit 202 may be implemented as a closed-loop control circuit that uses feedback derived from the recovery of data symbols from equalized signal 108 to maintain the amplitude of the data symbols at an optimum level for sampling. In various embodiments, automatic gain control circuit 202 may include any suitable combination of attenuator and amplifier circuits that can be dynamically activated or de-activated to maintain the amplitude of the data symbols.

Although a single automatic gain circuits is depicted in the embodiment of FIG. 2, in other embodiments where multiple equalized signals are needed, additional automatic gain control circuits may be employed. In such cases, the additional automatic gain circuits may apply differing amounts of gain and/or attenuation for their respective equalized signals.

Figure 3:
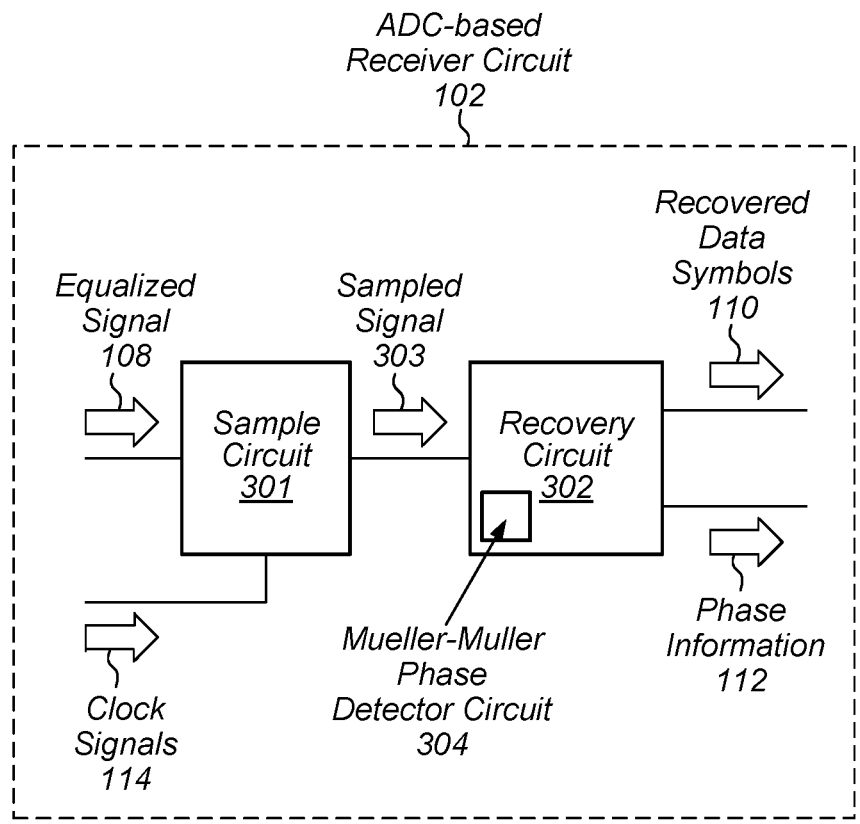
FIG. 3 is a block diagram of an embodiment of an ADC-based receiver circuit for a serial data receiver circuit.

Turning to FIG. 3, a block diagram of an embodiment of ADC-based receiver circuit 102 is depicted. As illustrated, ADC-based receiver circuit 102 incudes sample circuit 301 and recovery circuit 302.

Sample circuit 301 is configured to generate sample signal 303 using equalized signal 108 and clock signals 114. As described below, sample circuit 301 may, in various embodiments, include multiple analog-to-digital converter circuits. In such cases, sample circuit 301 may be further configured to select, based on the baud rate of the serial data stream that includes data symbols 107, to select a first analog-to-digital converter circuit of the multiple analog-to-digital converter circuits. The first analog-to-digital converter circuit may be configured to sample equalized signal 108 using clock signals 114 to generate sampled signal 303.

Sample circuit 301 may be further configured to select, based on the baud rate of the serial data stream that includes data symbols 107, a second analog-to-digital converter circuit of the multiple analog-to-digital converter circuits. The second analog-to-digital converter circuit is configured to sample equalized signal 108 using clock signals 114 to generate sampled signal 303. It is noted that sampled signal 303 may include a stream of multiple samples. In various embodiments, a resolution of the second analog-to-digital converter circuit is greater than a resolution of the first analog-to-digital converter circuit. As used and described herein, the resolution of an analog-to-digital converter circuit refers to the smallest incremental voltage that causes a change in the digital output of an analog-to-digital converter circuit. In some cases, a sample circuit, such as sample circuit 301, may include multiple groups of analog-to-digital circuits (referred to as "sub analog-to-digital converter circuits" or "sub-ADCs") coupled in parallel and activated in a sequential fashion to increase the resolution.

Recovery circuit 302 is configured to generate recovered data symbols 110 and phase information 112 using sample signal 303. To generate recovered data symbols 110 and phase information 112, recovery circuit 302 may be configured to perform equalization operations such as feed-forward equalization (FFE) and decision-feedback equalization (DFE). In other embodiments, recovery circuit 302 may be further configured to correct mismatch in sampled signal 303, as well as multiply sampled signal 303 by a gain factor. In various embodiments, recovery circuit 302 may be implemented as a digital signal processor (DSP) or other suitable processing circuit.

In various embodiments, recovery circuit 302 includes Mueller-Muller phase detector circuit 304, which is configured to generate phase information 112. In some embodiments, Mueller-Muller phase detector circuit 304 may be configured to adjust phase information 112 in order to make the respective magnitudes of the first pre-cursor and the first post-cursor of a given symbol the same. Although recovery circuit 302 is depicted as including Mueller-Muller phase detector circuit 304, in other embodiments, any suitable baud-rate phase detector circuit may be employed.

Figure 4:
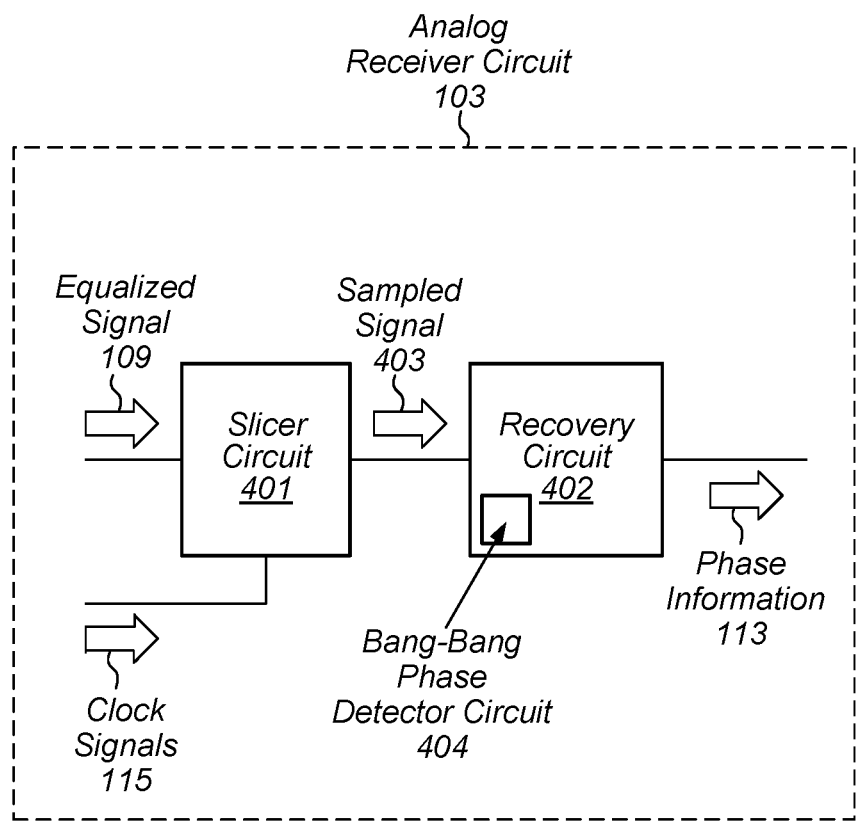
FIG. 4 is a block diagram of an embodiment of an analog receiver circuit for a serial data receiver circuit.

Turning to FIG. 4, a block diagram of an embodiment of analog receiver circuit 103 is depicted. As illustrated, analog receiver circuit 103 includes slicer circuit 401 and recovery circuit 402.

Slicer circuit 401 is configured to generate sampled signal 403 using equalized signal 109 and clock signals 115. In various embodiments, slicer circuit 401 is configured to compare equalized signal 109 to multiple threshold values. Such threshold values may correspond to voltage levels associated with pre-cursor or post-cursor effects. In various embodiments, slicer circuit 401 may be further configured to generate one or more error signals that can be included in phase information 113. In some embodiments, slicer circuit 401 may be further configured to perform equalization such as decision-feedback equalization (DFE).

Recovery circuit 402 is configured to generate phase information 113 using sampled signal 403. It is noted that sampled signal 403 may include a stream of samples generated by slicer circuit 401. In various embodiments, recovery circuit 402 include bang-bang phase detector circuit 404 (also referred to as an "Alexander phase detector circuit") that is configured to perform a comparison of the relative phases of clock signals 115 to transitions in sampled signal 403. Recovery circuit 402 is further configured to generate phase information 113 using results of the comparison. In various embodiments, phase information 113 may include information indicative of whether clock signals 115 are early or late relative to transitions in sampled signal 403.

It is noted that although recovery circuit 402 is depicted as including bang-bang phase detector circuit 404, in other embodiments, any suitable edge-based phase detection circuit may be employed.

Figure 5:
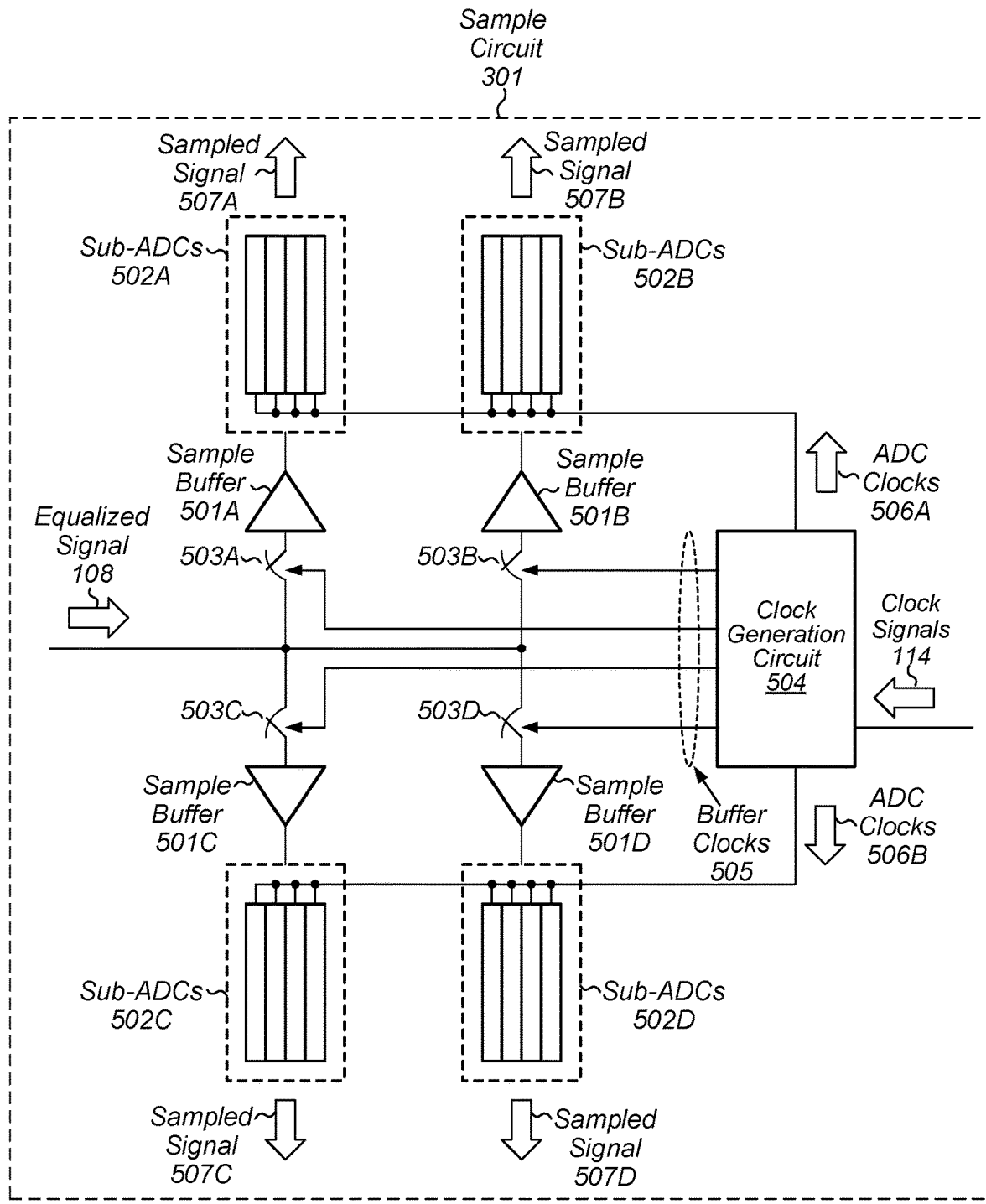
FIG. 5 is a block diagram of an embodiment of a sample circuit for an ADC-based receiver circuit.

Turning to FIG. 5, an embodiment of sample circuit 301 is depicted. As illustrated, sample circuit 301 includes sample buffers 501A-501D, sub-analog-to-digital converter circuits (denoted as "sub-ADCs 502A-502D"), switches 503A-503D, and clock generation circuit 504. It is noted that although four sample buffers, four switches, and four sub-ADCs are depicted in the embodiment of FIG. 5, in other embodiments, different numbers of sample buffers, switches, and sub-ADCs may be employed.

Switches 503A-503D are configured to couple, using buffer clocks 505, equalized signal 108 to corresponding ones of sample buffers 501A-501D. In various embodiments, each of buffer clocks 505 may be phase shifted from each other such that only one of switches 503A-503D is closed at any given time. The respective frequencies of buffer clocks 505 may, in various embodiments, be based on a frequency of clock signals 114, as well as the number of sample buffers and sub-ADCs included in sample circuit 301.

Switches 503A-503D may, in various embodiments, be implemented using one or more switch metal-oxide semiconductor field-effect transistors (MOSFETs), fin field-effect transistors (FinFETs), gate-all-around field-effect transistors (GAAFETs), or any other suitable switching devices.

Each of sample buffers 501A-501D are configured to buffer equalized signal 108 and to drive the analog-to-digital converter circuits included in corresponding ones of sub-ADCs 502A-502D. In various embodiments, sample buffers 501A-501D may be implemented as unity-gain amplifier circuits, or any other suitable circuits configured to buffer an analog signal and provide additional drive to allow for driving multiple analog-to-digital converter circuits.

Each of sub-ADCs 502A-502D includes multiple analog-to-digital converter circuits coupled to a corresponding one of sample buffers 501A-501D and configured to generate sampled signals 507A-507D based on a voltage level of the outputs of the corresponding one of sample buffers 501A-501D. In various embodiments, sampled signals 507A-507D each include a corresponding stream of samples generated by corresponding ones of sub-ADCs 502A-502D. The analog-to-digital circuits included in a given one of sub-ADCs 502A-502D are activated in sequence by ADC clocks 506A and 506B. In various embodiments, the number of analog-to-digital converter circuits included in a given sub-ADC determines an interleaving factor of the sub-ADC.

As described above, sub-ADCs 502A-502D can be activated in sequence. Once a particular one of sub-ADCs 502A-502D has been activated, the included analog-to-digital converter circuits may then be activated in sequence. In such cases, the sampled signals generated by sub-ADCs 502A-502D may be interleaved with each other. A recovery circuit, e.g., recovery circuit 302, may be configured to correctly align the samples, as well as re-time the data to a different, and possibly slower, clock domain.

When a given analog-to-digital converter circuit is activated, it samples the output of its corresponding sample buffer. Once the output has been sampled, there may be a period of time (referred to as a "resolution period" or a "resolve period") for the analog-to-digital converter circuit to generate multiple bits whose combined value corresponds to the voltage level of the sampled output. The duration of the resolution period and the number of bits generated vary with the type of analog-to-digital circuit employed. In various embodiments, the total of the sample and resolution periods for the analog-to-digital converter circuits included in a given sub-ADC may be less than or equal to an active time of a corresponding one of buffer clocks 505.

The individual analog-to-digital converter circuits included in sub-ADCs 502A-502D may be implemented as flash ADCs, successive-approximation ADCs, or any other suitable type of analog-to-digital converter circuits. Although only four ADCs are depicted as being included in sub-ADCs 502A-502D, in other embodiments, any suitable number of analog-to-digital converter circuits can be employed. In such cases, clock generation circuit 504 would be configured to generate the necessary number of ADC clock signals.

Clock generation circuit 504 is configured to generate buffer clocks 505 and ADC clocks 506A and 506B. In various embodiments, clock generation circuit 504 may be implemented using phase-locked loop circuits, delay-locked loops circuits, delay circuits, or any other type of circuit suitable for generating multiple clock signals with different phases.

Figure 6:
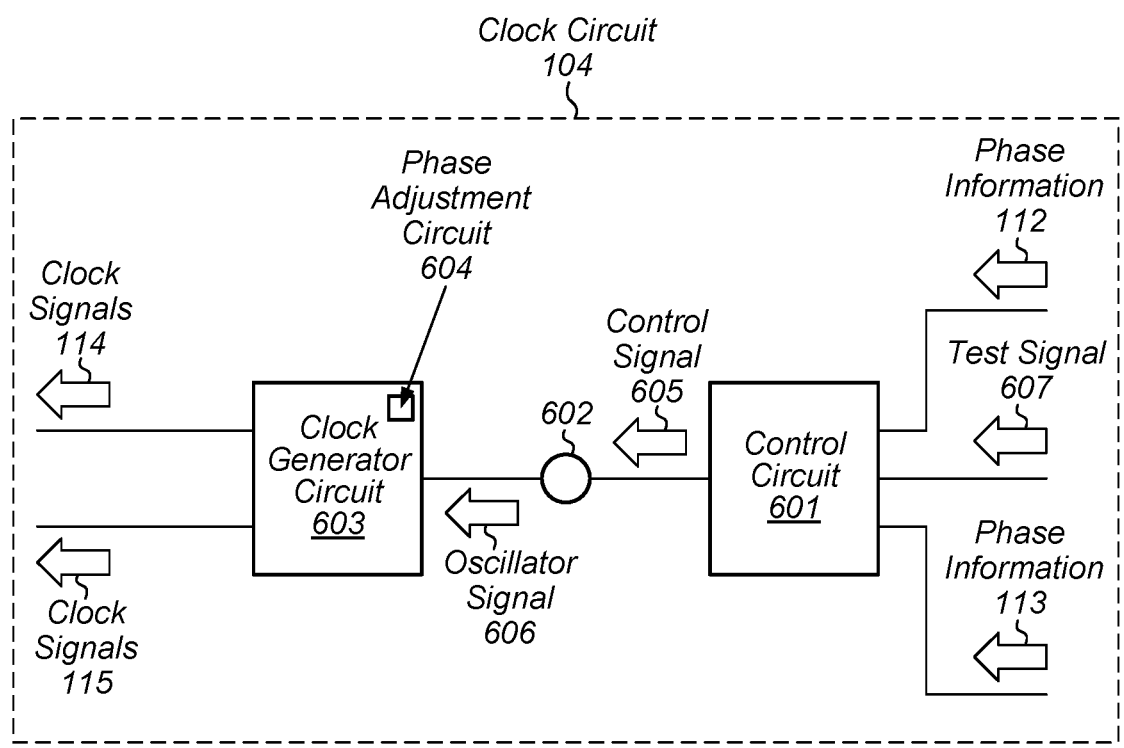
FIG. 6 is a block diagram of an embodiment of a clock circuit for a hybrid receiver circuit.

Turning to FIG. 6, a block diagram of an embodiment of clock circuit 104 is depicted. As illustrated, clock circuit 104 includes control circuit 601, oscillator circuit 602, and clock generator circuit 603.

Control circuit 601 is configured to generate control signal 605 using phase information 112 and phase information 113. In various embodiments, control circuit 601 may be configured to select one of phase information 112 or phase information 113 to generate control signal 605. In other embodiments, control circuit 601 may be configured to use a combination of phase information 112 and phase information 113 to generate control signal 605.

In some embodiments, control circuit 601 may be further configured to generate control signal 605 using test signal 607. In such case, test signal 607 may include information indicative of frequency and phase information for clock signals 114 and 115 to be used during a test mode. During such a test mode, control circuit 601 may be configured to ignore phase information 112 and phase information 113 and rely solely on the information included in test signal 607.

Oscillator circuit 602 is configured to generate oscillator signal 606, which may include one or more clock phases using control signal 605. In some embodiments, oscillator circuit 602 may be configured to adjust a frequency of oscillator signal 606 based on control signal 605. It is noted that control signal 605 may be an analog control signal, a digital control signal, or any suitable combination thereof. In various embodiments, oscillator circuit 602 may be an inductor-capacitor oscillator circuit (referred to as an "LC oscillator circuit"), or any other suitable oscillator circuit configured to adjust a frequency of an output signal based on a control signal.

Clock generator circuit 603 is configured to generate clock signals 114 and clock signal 115 using oscillator signal 606. In various embodiments, clock signals 114 and clock signals 115 may include any suitable number of clock signals. In various embodiments, clock generator circuit 603 may be further configured to delay oscillator signal 606 by various amounts in order to generate clock signals 114 and clock signals 115.

In various embodiments, clock generator circuit 603 includes phase adjustment circuit 604. During a foreground calibration operation, clock generator circuit 603 is configured to sweep the respective phases of clock signals 114 through a range of phase offsets. Based on phase information 112 gathered during the foreground calibration operation, clock generator circuit 603 may be configured to select a particular phase offset for phase adjustment circuit 604 to apply when generating the clock signals 114 and clock signals 115. In other embodiments, clock generator circuit 603 may perform a background adaptation of clock signals 115 relative to clock signals 114. In various embodiments, the adaptation may be performed using a Mueller-Muller adaptation criterion or any other suitable adaptation criteria. Phase adjustment circuit 604 may, in various embodiments, be implemented using a phase interpolator circuit or any suitable circuit configured to adjust the phase of a signal.

Figure 7:
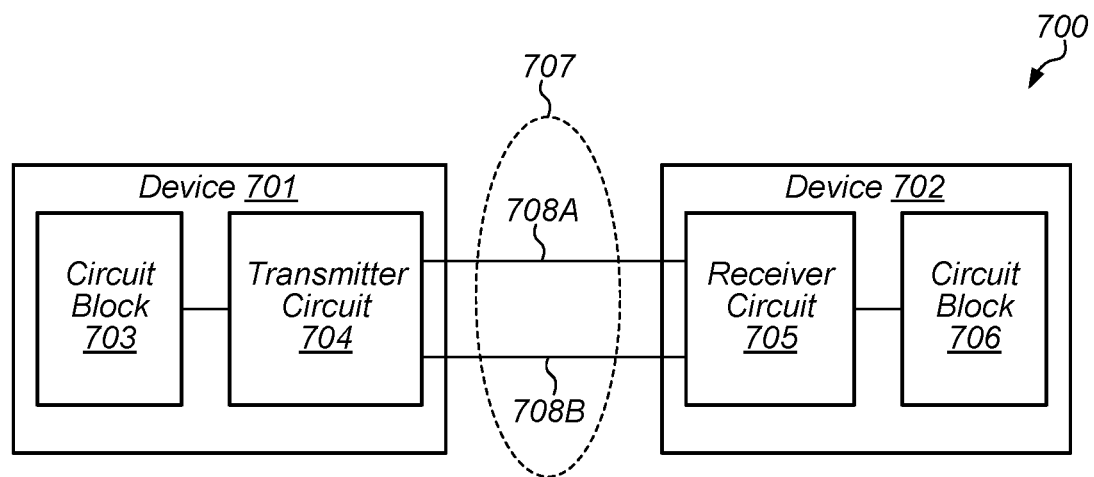
FIG. 7 is a block diagram of a computer system that includes a transmitter circuit and a receiver circuit.

As described above, a receiver circuit, such as hybrid receiver circuit 100, may be employed in a computer system. A block diagram of an embodiment of such a computer system is depicted in FIG. 7. As illustrated, computer system 700 includes devices 701 and 702, coupled by communication bus 707.

Device 701 includes circuit block 703 and transmitter circuit 704. In various embodiments, device 701 may be a processor circuit, a processor core, a memory circuit, or any other suitable circuit block that may be included on an integrated circuit in a computer system. It is noted that although device 701 only depicts a single circuit block and a single transmitter circuit, in other embodiments, additional circuit blocks and additional transmitter circuits may be employed.

Transmitter circuit 704 is configured to serially transmit signals, via communication bus 707, corresponding to data received from circuit block 703. Such signals may differentially encode one or more bits such that a difference between the respective voltage levels of wires 708A and 708B, at a particular point in time, correspond to a particular bit value. In some cases, the generation of the signals may include encoding the bits prior to transmission. It is noted that although communication bus 707 is depicted as including two wires, in other embodiments, any suitable number of wires may be employed.

Device 702 includes receiver circuit 705 and circuit block 706. Like device 701, device 702 may be a processor circuit, a processor core, a memory circuit, or any other suitable circuit block configured to receive data from transmitter circuit 704. In various embodiments, receiver circuit 705 may correspond to receiver circuit 100 as depicted in FIG. 1.

Devices 701 and 702 may, in some embodiments, be fabricated on a common integrated circuit. In other embodiments, devices 701 and 702 may be located on different integrated circuits mounted on a common substrate or circuit board. In such cases, communication bus 707 may include metal or other conductive traces on the substrate or circuit board. Although only two devices are depicted in computer system 700, in other embodiments, any suitable number of devices may be employed.

To summarize, various embodiments of a power delivery system for a computer system are disclosed. Broadly speaking, an apparatus is contemplated in which a front-end circuit may be configured to generate an equalized signal using a plurality of signals that encode a serial data stream that includes a plurality of data symbols, and an analog receiver circuit may be configured to sample, using a plurality of first clock signals, the equalized signal to generate a plurality of first samples. A clock generator circuit may be configured to generate the plurality of first clock signals using first phase information based on a phase difference between the plurality of first clock signals and the plurality of first samples, and generate a plurality of second clock signals using the first phase information. An analog-to-digital converter (ADC)-based receiver circuit, that includes an analog-to-digital converter circuit, may be configured to sample the equalized signal using the plurality of second clock signals to generate a plurality of recovered data symbols.

Figure 8:
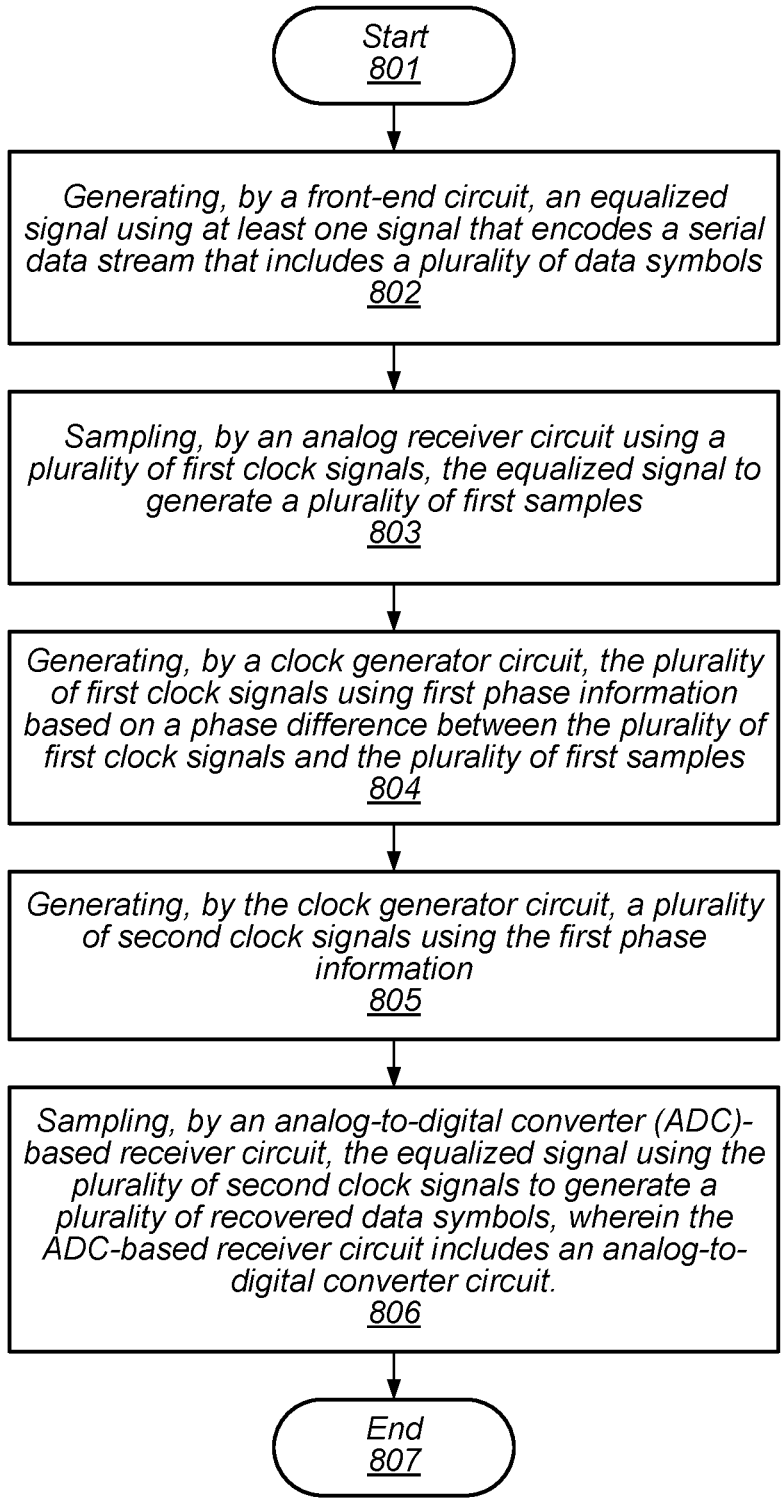
FIG. 8 is a flow diagram of an embodiment of a method for operating a receiver circuit.

Turning to FIG. 8, a flow diagram depicting an embodiment of a method for operating a hybrid receiver circuit is illustrated. The method, which may be applied to various hybrid receiver circuits such as receiver circuit 100, begins in block 801.

The method includes generating, by a front-end circuit, an equalized signal using at least one signal that encodes a serial data stream that includes a plurality of data symbols (block 802). In some embodiments, generating the equalized signal includes filtering the plurality of signals to generate a filtered signal. In such cases, the method can include buffering, with a gain factor, the filtered signal to generate the equalized signal. In various embodiments, the method may further include generating a plurality of equalized signals using the at least one signal.

The method also includes sampling, by an analog receiver circuit using a plurality of first clock signals, the equalized signal to generate a plurality of first samples (block 803). In various embodiments, sampling the equalized signal includes comparing the equalized signal to multiple threshold values, and storing results of the sampling using the plurality of first clock signals. In some cases, the multiple threshold values may correspond to voltage levels associated with pre-cursor or post-cursor effects. In some embodiments, the plurality of first samples may include error information that can be included in phase information 113.

The method further includes generating, by a clock generator circuit, the plurality of first clock signals using first phase information based on a phase difference between the plurality of first clock signals and the plurality of first samples (block 804). In some embodiments, the clock generator circuit can include a plurality of oscillator circuits. In such cases, generating the plurality of first clock signals includes adjusting a frequency of at least one oscillator circuit of the plurality of oscillator circuits using the first phase information.

The method also includes generating, by the clock generator circuit, a plurality of second clock signals using the first phase information (block 805). In various embodiments, the method can also include generating, by the clock generator circuit, the plurality of second clock signals using second phase information after a given period of time has elapsed. In some embodiments, the given period of time begins from a start of data being transmitted on a communication channel.

The method further includes sampling, by an analog-to-digital converter (ADC)-based receiver circuit, the equalized signal using the plurality of second clock signals to generate a plurality of recovered data symbols (block 806). In various embodiments, the ADC-based receiver circuit includes at least one analog-to-digital converter circuit. In some embodiments, sampling the equalized signal using the plurality of second clock signals includes generating a plurality of second samples. In other embodiments, the second phase information may be based on a second phase difference between the plurality of second clock signals and the plurality of recovered data symbols.

In some embodiments, the method may include performing, by a bang-bang phase detector, a first phase comparison operation between the plurality of first clock signals and the plurality of first samples, and generating, by the analog receiver circuit, the first phase information using a result of the first phase comparison operation. In other embodiments, the method may include performing, by a Mueller-Muller phase detector circuit included in the ADC-based receiver circuit, a second phase comparison operation between the plurality of second clock signals and the plurality of recovered data symbols, and generating, by the ADC-based receiver circuit, the first phase information using a result of the second phase comparison operation.

In various embodiments, the method may further include, in response to an activation of a foreground calibration operation, sweeping the sampling phase of the ADC-based receiver circuit. In other embodiments, the method may also include, in response to an activation of a background calibration operation, adapting the sampling phase of sub-ADCs (e.g., sub-ADCs 502A-502D) relative to the edge sampling phase of the analog receiver circuit. It some embodiments, the method may include adapting the sampling phase using a Mueller-Muller adaptation criterion or any other suitable adaptation criteria.

It is noted that the method described above may be used during an initialization operation, during periodic calibration operations, and during "mission mode" when actual data symbols are being transmitted on the communication channel. The method concludes in block 807.

Figure 9:
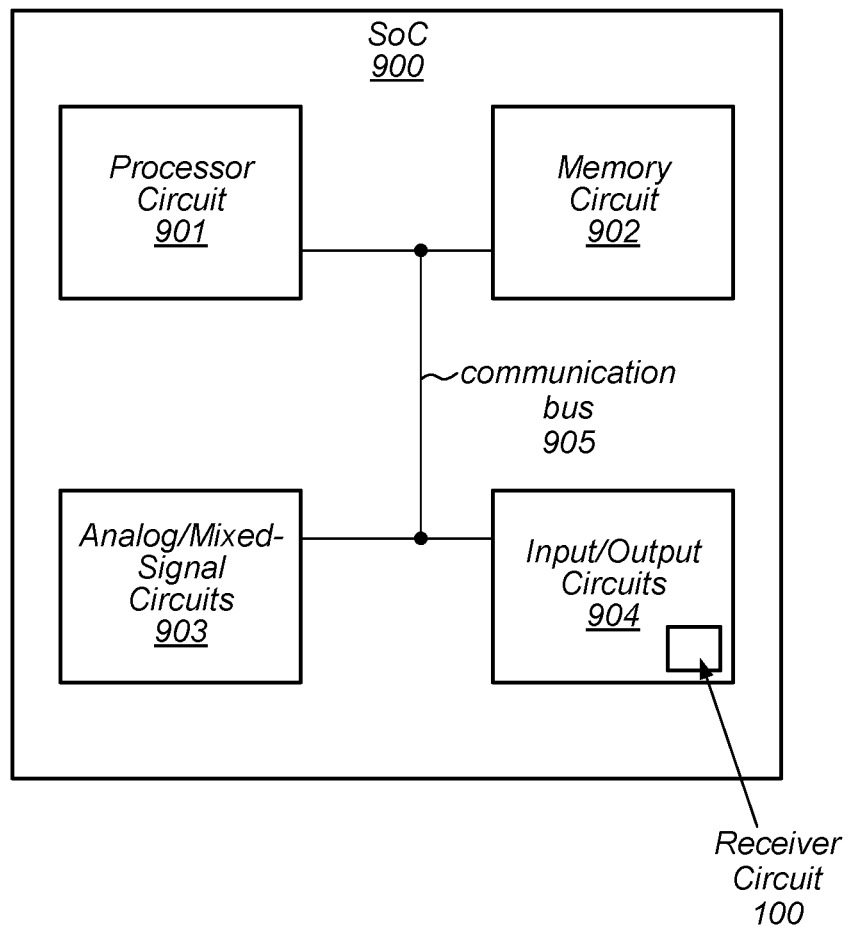
FIG. 9 is a block diagram of one embodiment of a system-on-a-chip that includes a receiver circuit.

A block diagram of a system-on-a-chip (SoC) is illustrated in FIG. 9. In the illustrated embodiment, SoC 900 includes processor circuit 901, memory circuit 902, analog/mixed-signal circuits 903, and input/output circuits 904, each of which is coupled to communication bus 905. In various embodiments, SoC 900 may be configured for use in a desktop computer, server, or in a mobile computing application such as, e.g., a tablet, laptop computer, or wearable computing device.

Processor circuit 901 may, in various embodiments, be representative of a general-purpose processor that performs computational operations. For example, processor circuit 901 may be a central processing unit (CPU) such as a microprocessor, a microcontroller, an application-specific integrated circuit (ASIC), or a field-programmable gate array (FPGA).

Memory circuit 902 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 9, in other embodiments, any suitable number of memory circuits may be employed.

Analog/mixed-signal circuits 903 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 903 may be configured to perform power management tasks with the inclusion of on-chip power supplies and voltage regulators.

Input/output circuits 904 may be configured to coordinate data transfer between SoC 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 904 may be configured to implement a version of Universal Serial Bus (USB) protocol or IEEE 1394 (Firewire®) protocol, and include receiver circuit 100 as depicted in the embodiment of FIG. 1.

Input/output circuits 904 may also be configured to coordinate data transfer between SoC 900 and one or more devices (e.g., other computing systems or integrated circuits) coupled to SoC 900 via a network. In one embodiment, input/output circuits 904 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 904 may be configured to implement multiple discrete network interface ports.

Figure 10:
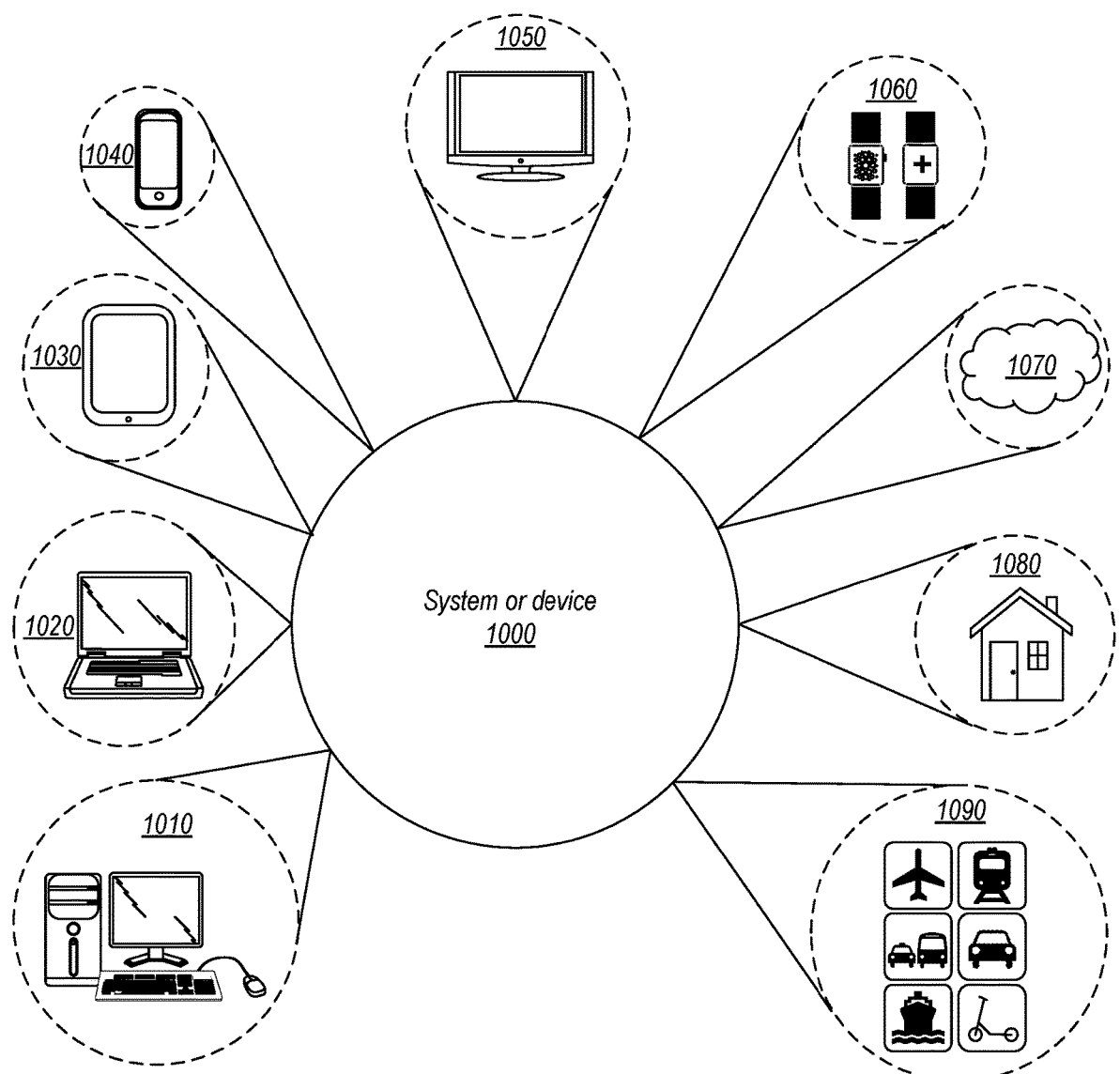
FIG. 10 is a block diagram of various embodiments of computer systems that may include receiver circuits.

Turning now to FIG. 10, various types of systems that may include any of the circuits, devices, or systems discussed above are illustrated. System or device 1000, which may incorporate or otherwise utilize one or more of the techniques described herein, may be utilized in a wide range of areas. For example, system or device 1000 may be utilized as part of the hardware of systems such as a desktop computer 1010, laptop computer 1020, tablet computer 1030, cellular or mobile phone 1040, or television 1050 (or set-top box coupled to a television).

Similarly, disclosed elements may be utilized in a wearable device 1060, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1000 may also be used in various other contexts. For example, system or device 1000 may be utilized in the context of a server computer system, such as a dedicated server or on shared hardware that implements a cloud-based service 1070. Still further, system or device 1000 may be implemented in a wide range of specialized everyday devices, including devices 1080 commonly found in the home such as refrigerators, thermostats, security cameras, etc. The interconnection of such devices is often referred to as the "Internet of Things" (IoT). Elements may also be implemented in various modes of transportation. For example, system or device 1000 could be employed in the control systems, guidance systems, entertainment systems, etc. of various types of vehicles 1090.

The applications illustrated in FIG. 10 are merely exemplary and are not intended to limit the potential future applications of disclosed systems or devices. Other example applications include, without limitation: portable gaming devices, music players, data storage devices, unmanned aerial vehicles, etc.

Figure 11:
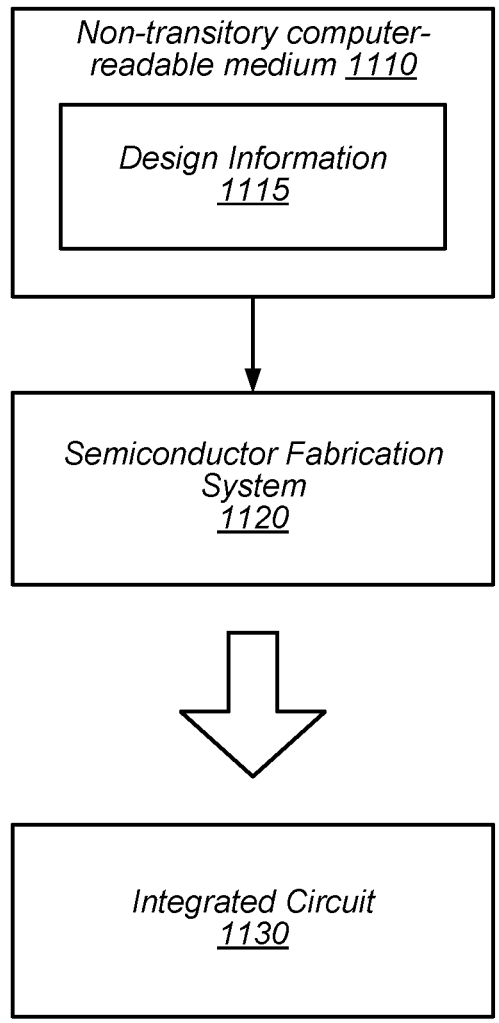
FIG. 11 illustrates an example of a non-transitory computer-readable storage medium that stores circuit design information.

FIG. 11 is a block diagram illustrating an example of a non-transitory computer-readable storage medium that stores circuit design information, according to some embodiments. In the illustrated embodiment, semiconductor fabrication system 1120 is configured to process design information 1115 stored on non-transitory computer-readable storage medium 1110 and fabricate integrated circuit 1130 based on design information 1115.

Non-transitory computer-readable storage medium 1110 may comprise any of various appropriate types of memory devices or storage devices. Non-transitory computer-readable storage medium 1110 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1110 may include other types of non-transitory memory as well or combinations thereof. Non-transitory computer-readable storage medium 1110 may include two or more memory mediums, which may reside in different locations, e.g., in different computer systems that are connected over a network.

Design information 1115 may be specified using any of various appropriate computer languages, including hardware description languages such as, without limitation: VHDL, Verilog, SystemC, SystemVerilog, RHDL, M, MyHDL, etc. Design information 1115 may be usable by semiconductor fabrication system 1120 to fabricate at least a portion of integrated circuit 1130. The format of design information 1115 may be recognized by at least one semiconductor fabrication system, such as semiconductor fabrication system 1120, for example. In some embodiments, design information 1115 may include a netlist that specifies elements of a cell library, as well as their connectivity. One or more cell libraries used during logic synthesis of circuits included in integrated circuit 1130 may also be included in design information 1115. Such cell libraries may include information indicative of device or transistor level netlists, mask design data, characterization data, and the like, of cells included in the cell library.

Integrated circuit 1130 may, in various embodiments, include one or more custom macrocells, such as memories, analog or mixed-signal circuits, and the like. In such cases, design information 1115 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 is configured to operate according to a circuit design specified by design information 1115, which may include performing any of the functionality described herein. For example, integrated circuit 1130 may include any of various elements shown or described herein. Further, integrated circuit 1130 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of the claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
a front-end circuit configured to generate an equalized signal using a plurality of signals that encode a serial data stream that includes a plurality of data symbols;
an analog receiver circuit configured to sample, using a plurality of first clock signals, the equalized signal to generate a plurality of first samples;
a clock generator circuit configured to:
generate the plurality of first clock signals using first phase information based on a phase difference between the plurality of first clock signals and the plurality of first samples; and
generate a plurality of second clock signals using the first phase information; and
an analog-to-digital converter (ADC)-based receiver circuit that includes an analog-to-digital converter circuit wherein the ADC-based receiver circuit is configured to sample the equalized signal using the plurality of second clock signals to generate a plurality of recovered data symbols.

2. The apparatus of claim 1, wherein the clock generator circuit is further configured to generate the plurality of second clock signals using second phase information based on a second phase difference between the plurality of second clock signals and the plurality of recovered data symbols.

3. The apparatus of claim 2, wherein the analog receiver circuit includes a bang-bang phase detector circuit configured to:
perform a phase comparison operation between the plurality of first clock signals and the plurality of first samples; and
generate the first phase information and the second phase information using a result of the phase comparison operation.

4. The apparatus of claim 2, wherein the ADC-based receiver circuit includes a Mueller-Muller phase detector circuit configured to:
perform a phase comparison operation between the plurality of second clock signals and the plurality of recovered data symbols; and
generate the first phase information using a result of the phase comparison operation.

5. The apparatus of claim 1, wherein the clock generator circuit is further configured, in response to an activation of a foreground calibration operation, sweep, through a series of phase values, respective phases of the plurality of second clock signals relative to the plurality of first clock signals.

6. The apparatus of claim 5, wherein the ADC-based receiver circuit includes a phase adjustment circuit configured, in response to an activation of a background calibration operation, to:
adapt relative phases of the plurality of second clock signals; and
sample the equalized signal at each of the series of phase values to generate a plurality of calibration samples; and
wherein the clock generator circuit is further configured, in response to the activation of the background calibration operation, to adjust the respective phases of the plurality of second clock signals using the plurality of calibration samples relative to the plurality of first clock signals.

7. A method, comprising:
generating, by a front-end circuit, an equalized signal using a plurality of signals that encode a serial data stream that includes a plurality of data symbols;
sampling, by an analog receiver circuit using a plurality of first clock signals, the equalized signal to generate a plurality of first samples;
generating, by a clock generator circuit, the plurality of first clock signals using first phase information based on a phase difference between the plurality of first clock signals and the plurality of first samples;

generating, by the clock generator circuit, a plurality of second clock signals using the first phase information; and sampling, by an analog-to-digital converter (ADC)-based receiver circuit, the equalized signal using the plurality of second clock signals to generate a plurality of recovered data symbols, wherein the ADC-based receiver circuit includes an analog-to-digital converter circuit.

8. The method of claim 7, further comprising generating, by the clock generator circuit, the plurality of second clock signals using second phase information based on a second phase difference between the plurality of second clock signals and the plurality of recovered data symbols.

9. The method of claim 8, further comprising:
performing, by a bang-bang phase detector circuit included in the analog receiver circuit, a phase comparison operation between the plurality of first clock signals and the plurality of first samples; and
generating, by the analog receiver circuit, the first phase information using a result of the phase comparison operation.

10. The method of claim 8, further comprising:
performing, by a Mueller-Muller phase detector circuit included in the ADC-based receiver circuit, a phase comparison operation between the plurality of second clock signals and the plurality of recovered data symbols; and
generating, by the ADC-based receiver circuit, the first phase information using a result of the phase comparison operation.

11. The method of claim 7, further comprising, in response to an activation of a foreground calibration operation:
sampling, by the analog receiver circuit, an equalized version of a test signal using the plurality of first clock signals to generate a plurality of test samples; and
adjusting, by the clock generator circuit, respective phases of the plurality of first and second clock signals using the plurality of test samples.

12. The method of claim 11, further comprising:
in response to an activation of a background calibration operation:
adapting relative phases of the plurality of second clock signals;
sampling the equalized signal at each of a series of phase values to generate a plurality of calibration samples; and
adjusting the respective phases of the second clock signals relative to the plurality of first clock signals using the plurality of calibration samples.

13. The method of claim 7, wherein generating the plurality of first clock signals includes tuning an oscillator circuit included in the clock generator circuit using the first phase information.

14. An apparatus, comprising:
a first device that includes a first functional circuit block, wherein the first device is configured to:
receive, from the first functional circuit block, a serial data stream that includes a plurality of data symbols;
generate a plurality of signals that encode the serial data stream; and
transmit the plurality of signals via a communication channel; and
a second device coupled to the first device via the communication channel, wherein the second device includes a plurality of receiver circuits, and wherein the second device is configured to generate an equalized signal using a plurality of signals that encode a serial data stream that includes a plurality of data symbols; and wherein a first receiver circuit of the plurality of receiver circuits, that includes an analog receiver circuit, is configured to sample using a plurality of first clock signals, the equalized signal to generate a plurality of first samples;

wherein a second receiver circuit of the plurality of receiver circuits, that includes an analog-to-digital converter circuit, is configured to sample the equalized signal using a plurality of second clock signals to generate a plurality of recovered data symbols; and wherein the second device is further configured to:
generate the plurality of first clock signals using first phase information based on a phase difference between the plurality of first clock signals and the plurality of first samples; and
generate the plurality of second clock signals using the first phase information.

15. The apparatus of claim 14, wherein the second device is further configured to generate the plurality of second clock signals using second phase information based on a second phase difference between the plurality of second clock signals and the plurality of recovered data symbols.

16. The apparatus of claim 15, wherein the first receiver circuit includes a bang-bang phase detector circuit configured to perform a phase comparison operation between the plurality of first clock signals and the plurality of first samples, and wherein the first receiver circuit is further configured to generate the first phase information using a result of the phase comparison operation.

17. The apparatus of claim 15, wherein the second receiver circuit includes a Mueller-Muller phase detector circuit configured to perform a phase comparison operation between the plurality of second clock signals and the plurality of recovered data symbols, and wherein the second receiver circuit is configured to generate the first phase information using a result of the phase comparison operation.

18. The apparatus of claim 14, wherein the second device is configured, in response to an activation of a foreground calibration operation to:
sweep, through a series of phase values, respective phases of the plurality of second clock signal relative to the plurality of first clock signals;
sample an equalized version of a test signal using the plurality of second clock signals to generate a plurality of test samples; and
select a particular phase offset for the plurality of second clock signals using the plurality of test samples.

19. The apparatus of claim 14, wherein the second device is configured, in response to an activation of a background calibration operation, to adapt respective phases of the plurality of second clock signals relative to the plurality of first clock signals.

20. The apparatus of claim 14, wherein the second device includes an oscillator circuit, and wherein to generate the plurality of first clock signals, the second device is further configured to tune the oscillator circuit using the first phase information.

* * * * *